July 1, 1958 C. C. BOPP ET AL 2,841,703

TRANSISTOR MIXER CIRCUIT WITH GAIN CONTROL

Filed Jan. 10, 1956

INVENTORS.
RICHARD W. BRADMILLER.
CALVIN C. BOPP.
BY Alden D. Redfield.
Charles M. Hogan.
ATTORNEYS.

United States Patent Office 2,841,703

Patented July 1, 1958

2,841,703

TRANSISTOR MIXER CIRCUIT WITH GAIN CONTROL

Calvin C. Bopp and Richard W. Bradmiller, Cincinnati, Ohio, assignors to Avco Manufacturing Corporation, Cincinnati, Ohio, a corporation of Delaware Application January 10, 1956, Serial No. 558,366

2 Claims. (Cl. 250—20)

Figures 1, 2:
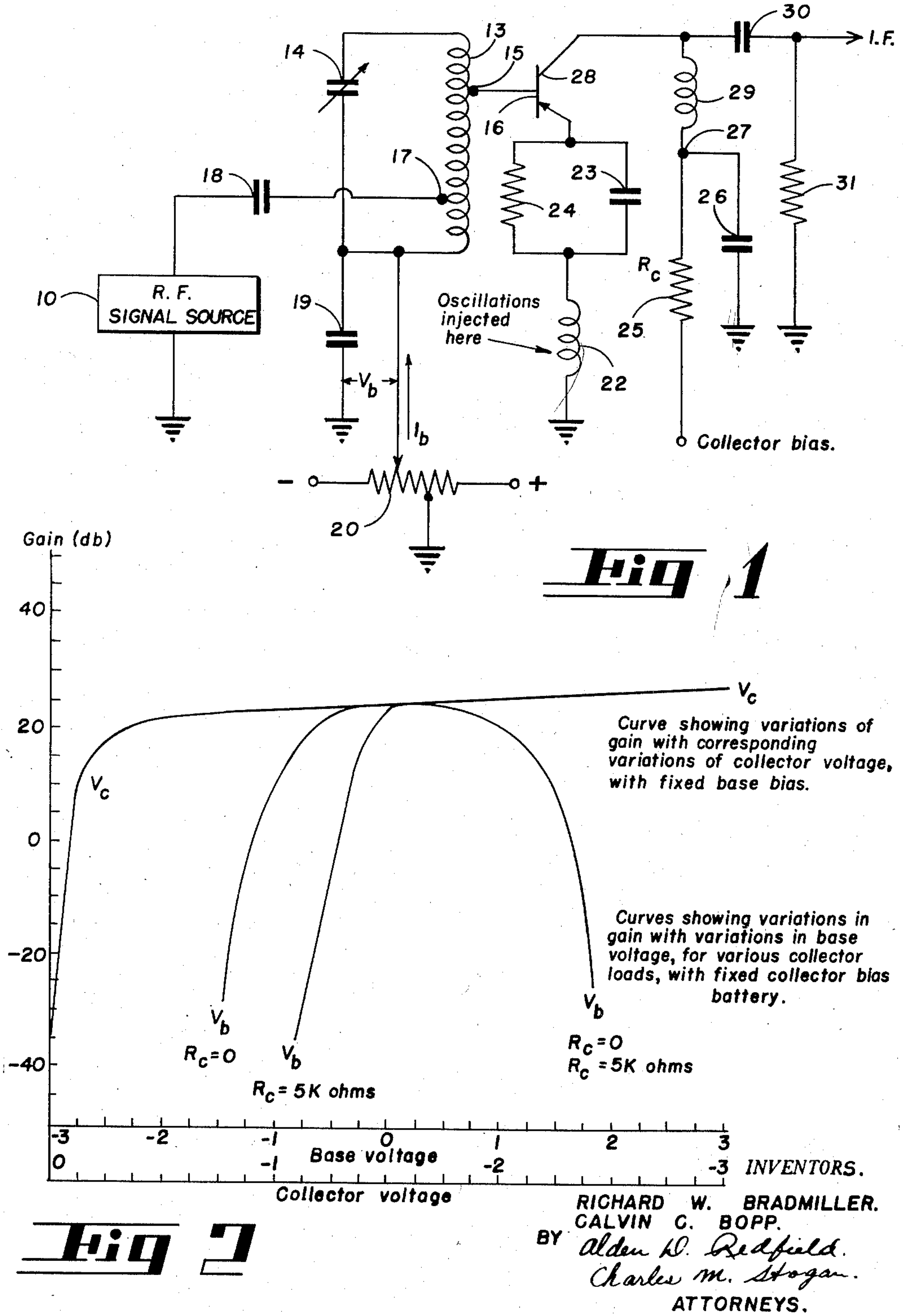

The present invention relates to transistor circuits and particularly to a novel gain-controlled mixer circuit.

A primary object of the invention is to provide, in a transistorized receiver, a system of gain control which has a low D. C. power requirement of approximately one order of magnitude less than that involved in controlling the gain of an I. F. amplifier circuit. Such requirement is computed on the basis of decibels gain reduction per microwatt of AVC power.

Another major object of the invention is to utilize a combination of means for varying the forward base bias of a transistor to control gain, while providing a collector circuit network which simultaneously varies the collector voltage in such a manner as to produce a supplemental control, so that gain is simultaneously controlled by both of these effects. In a typical circuit in accordance with the invention, a gain variation of 60 decibels is effected with a requirement of only 40 microwatts of power from the AGC source (conventionally a diode detector).

A further object of the invention is to minimize detuning effects by the convenient use of low L/C ratios in the tuned mixer input circuit. The invention capitalizes on the facility with which this expedient is employed in conjunction with a mixer, substantially greater difficulties being involved in efforts to overcome such effects in an I. F. system, particularly in a case where I. F. selectivity is obtained by interstage tuned circuits.

For a better understanding of the invention, together with other and further objects, advantages, and capabilities thereof, reference is made to the accompanying drawings, in which:

Fig. 1 is a circuit schematic of a preferred illustrative embodiment of the invention, and Fig. 2 comprises characteristic or performance curves explanatory of its operation.

In Fig. 2 there is shown, on a framework of Cartesian coordinates, a collector voltage curve designated as $V_c$. Collector voltage values are shown as abscissae on the framework pertinent to this curve, and the axis of ordinates is calibrated in terms of gain in decibels. Disregarding for the moment the collector circuit network of Fig. 1, comprising the resistor 25 and the capacitor 26, and assuming the availability of a test source for applying variable manually controlled amounts of collector voltage to point 27, we have found that in a test circuit involving these assumptions the conversion gain of a mixer circuit in accordance with Fig. 1 decreases by a small amount as the collector voltage is decreased from −2 to −.4, and then decreases rapidly as the collector voltage approaches zero. The dynamic range exceeds 40 decibels, with a small D. C. power requirement. This is the supplemental effect which is utilized in the Fig. 1 mixer circuit in accordance with the invention.

The other control effect utilized in the Fig. 1 mixer circuit is that which accompanies a variation in the base voltage, as applied to the base of the transistor with the polarity appropriate for increasing base current. This polarity is negative for PNP and positive for NPN type transistors. Putting aside discussion of this effect for the moment, we provide for the first-mentioned or supplemental control effect by adding a resistor 25 in series with the D. C. supply to the collector in order to permit the D. C. collector voltage to decrease as the collector current increases with increments in base current. The network including resistor 25 thus produces the supplemental control effect, illustrated by curve $V_c$ in Fig. 2.

Returning now to consideration of the second-mentioned control effect, let us consider the curves marked $V_b$ in Fig. 2, again plotted on a framework of Cartesian coordinates with base voltage values as abscissae and gain values as ordinates. We have found that in the Fig. 1 circuit a reduction in gain may be obtained by biasing the base (or emitter) either in the less conductive or more conductive direction. In accordance with the Fig. 1 embodiment of the present invention, as indicated above, the second-mentioned control effect is accomplished by applying the AGC control voltage to the base of the transistor in the forward or conductive direction (negative for type PNP). This control effect causes a reduction in gain due to operation on the more linear slope of the emitter-base diode characteristic curve.

By the simultaneous use of both of the previously described effects, we have found that in a typical circuit in accordance with Fig. 1 the aforementioned gain variation of 60 decibels can be accomplished with a drain of only 40 microwatts of power from the AGC circuit.

With these control effects in mind, let us now consider the preferred embodiment of the invention illustrated in Fig. 1. The mixer schematic therein shown includes a source of carrier or radio frequency signals 10, matched to the input of a PNP type transistor by an appropriately tapped tuned circuit comprising the parallel connected combination of an inductance 13 and a variable capacitor 14. The inductor is provided with a tap 15 directly connected to the base 16 of the transistor and with a tap 17 coupled as by a capacitor 18 to the signal source 10. An R. F. bypass capacitor 19 is connected between the low potential end terminal of the tuned circuit and ground.

A potentiometer 20, having a grounded center tap and end terminals connected to base voltage supply sources of opposite polarities, is connected conductively in circuit with the base 16 to supply base voltage in variable fashion. In the preferred embodiment of the invention, we utilize the negative portion of this potentiometer when a PNP type transistor is employed. It will be understood that this portion is in effect a source of forward bias for the base and that a detector can function as an equivalent source, automatically to supply the base bias.

The transistor is arranged to operate in the grounded emitter category, and local oscillator signals are inserted in the emitter circuit, which comprises a series combination of a coil 22 and a filter 23—24. It will be understood that the coil 22 is suitably inductively coupled to an oscillator tank circuit (not shown).

The invention provides for the combination of both collector and base voltage control by utilizing the D. C. amplifier characteristics of the transistor. This is accomplished by adding a resistor 25 in the collector circuit, in series between the collector 28 and the fixed collector supply (not shown) designated by the expression "collector bias." This resistor is in series with coil 29 and is bypassed by capacitor 26. The load provided by this resistor permits the collector voltage to fall with increase in forward base bias and resultant increments of collector current. Also shown in Fig. 1 is a coupling network to the I. F. amplifier, which network includes a series capacitor 30 and a shunt resistor 31.

The following parameters are offered, not by way of restriction or limitation, but as illustrative of values which have been found satisfactory in one practical embodiment of the invention:

| | | |
|---|---|---|
| Capacitor **18** | microfarad | 0.1 |
| Capacitor **14** | micromicrofarads | 200 |
| Coil **13** | microhenries | 12 |
| Resistor **25** ($R_c$) | ohms | 5000 |
| Capacitor **19** | microfarad | 0.1 |
| Transistor | | Type L5100 |
| Resistor **24** | ohms | 4700 |
| Capacitor **23** | microfarad | 0.1 |
| Coil **29** | microhenries | 1.5 |
| Capacitor **26** | microfarad | 0.1 |
| Capacitor **30** | micromicrofarads | 60 |
| Resistor **31** | ohms | 100 |

While there has been shown and described what is believed to be the preferred embodiment of the invention, various changes and modifications will occur to those skilled in the art, and we desire appropriately to cover in the appended claims such of these as are within the fair scope of the invention.

We claim:

1. A transistor mixer circuit comprising a transistor having base and emitter and collector elements arranged in a common-emitter configuration, means for applying radio frequency carrier signals to said base, means in circuit with said emitter for injecting locally produced oscillations, automatic gain control voltage supply means for biasing the diode formed by the base and emitter in a forward direction to provide an emitter current gain control effect, said means being so proportioned that the mixer circuit operates on the forward-bias portion of a curve plotted on a framework of Cartesian coordinates with base voltages as abscissae and gain values as ordinates, gain decreasing with increase in input signal and emitter current and resultant increase in said biasing, a source of reverse collector bias voltage, and a collector load resistor connected in series between said collector and said source, for producing a supplemental collector voltage gain control effect, said source and resistor being so proportioned that the mixer circuit operates on the corresponding portion of a curve plotted on a framework of Cartesian coordinates with collector voltages as abscissae and gain values as ordinates, gain decreasing with increase in input signal, whereby the change of gain produced by the first gain control effect is supplemented by the change of gain produced by the second gain control effect, said portions being inclined in the same general directions on their frameworks of coordinates, so that the two gain control effects are cooperative and mutually supplemental.

2. A transistor mixer circuit comprising a transistor having base and emitter and collector elements, means for applying radio frequency carrier signals to said base, means in circuit with said emitter for injecting locally produced oscillations, automatic gain control voltage supply means for biasing the diode formed by the base and emitter in a forward direction to provide an emitter current gain control effect, said means being so proportioned that the mixer circuit operates on the forward bias portion of a curve plotted on a framework of Cartesian coordinates with base voltages as abscissae and gain values as ordinates, gain decreasing with increase in input signal and emitter current and resultant increase in said biasing, a source of reverse collector bias voltage, and a collector load resistor connected in series between said collector and said source, for producing a supplemental collector voltage gain control effect, said source and resistor being so proportioned that the mixer circuit operates on the corresponding portion of a curve plotted on a framework of Cartesian coordinates with collector voltages as abscissae and gain values as ordinates, gain decreasing with increase in input signal, whereby the change of gain produced by the first gain control effect is supplemented by the change of gain produced by the second gain control effect, said portions being inclined in the same general directions on their frameworks of coordinates, so that the two gain control effects are cooperative and mutually supplemental.

References Cited in the file of this patent

"Automatic Gain Control of Transistor Amplifiers" by Chow and Stern, Institute of Radio Engineers Transactions on Broadcast and Television Receivers, vol. BTR-1 Number 2, April 1955, pages 1 to 15. (Text of a paper presented at IRE—RETMA Radio fall meeting, Oct. 18, 1954, at Syracuse, N. Y.)

"Automatic Gain Control of Transistor Amplifiers" by Chow and Stern, Proceedings, Inst. of Radio Eng., September 1955, pages 1119 to 1127, of which only page 1127 is cited.

Zawels: The Transistor as a Mixer, Proc. I. R. E., March 1954, pages 542–548.

Stern et al.: Transistor Broadcast Receivers, Electrical Engineering, December 1954, pp. 1107–1112.